(12) United States Patent
Jeon et al.

(10) Patent No.: US 7,714,647 B2
(45) Date of Patent: May 11, 2010

(54) MULTIPLE OUTPUT POWER MODE AMPLIFIER

(75) Inventors: Moon-Suk Jeon, Seoul (KR); Jung-Hyun Kim, Uiwang (KR); Young Kwon, Thousand Oaks, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/544,308

(22) Filed: Aug. 20, 2009

(65) Prior Publication Data

US 2009/0309656 A1  Dec. 17, 2009

Related U.S. Application Data

(63) Continuation of application No. 11/651,166, filed on Jan. 9, 2007, now Pat. No. 7,616,054.

(51) Int. Cl.
*H03F 1/14* (2006.01)
(52) U.S. Cl. .................. 330/51; 330/124 R; 330/302
(58) Field of Classification Search .............. 330/51, 330/124 R, 302
See application file for complete search history.

(56) References Cited

U.S. PATENT DOCUMENTS

| | | | |
|---|---|---|---|
| 3,434,070 A | 3/1969 | Bartnik et al. |
| 5,152,004 A | 9/1992 | Vaisanan et al. |
| 5,175,871 A | 12/1992 | Kunkel |
| 5,276,912 A | 1/1994 | Siwiak et al. |
| 5,530,923 A | 6/1996 | Heinonen et al. |
| 5,661,434 A | 8/1997 | Brozovich et al. |
| 5,758,269 A | 5/1998 | Wu |
| 5,909,643 A | 6/1999 | Aihara |
| 6,043,721 A | 3/2000 | Nagode et al. |
| 6,060,949 A | 5/2000 | Kaufman et al. |
| 6,066,983 A | 5/2000 | Okoro |
| 6,069,526 A | 5/2000 | Ballantyne |
| 6,205,318 B1 | 3/2001 | Schindler et al. |
| 6,356,150 B1 | 3/2002 | Spears et al. |
| 6,363,685 B1 | 4/2002 | Kugler |
| 6,374,116 B1 | 4/2002 | Peterzell et al. |
| 6,487,419 B1 | 11/2002 | Freed |
| 6,603,359 B2 | 8/2003 | Fujiwara et al. |
| 6,630,861 B2 | 10/2003 | Kawaoka |
| 6,700,439 B2 | 3/2004 | Jackson |
| 6,900,692 B2 | 5/2005 | Kim et al. |
| 6,943,631 B2 | 9/2005 | Scherrer et al. |
| 7,161,422 B2 | 1/2007 | Kim |
| 7,382,186 B2 | 6/2008 | Apel et al. |
| 7,385,445 B2 | 6/2008 | Wright |

(Continued)

FOREIGN PATENT DOCUMENTS

EP  0977354  2/2000

(Continued)

OTHER PUBLICATIONS

Office Action dated Jul. 1, 2008 in U.S. Appl. No. 11/651,166.

(Continued)

*Primary Examiner*—Patricia Nguyen

(57) ABSTRACT

A multi-mode power amplifier and an electronic device including the amplifier are described.

4 Claims, 6 Drawing Sheets

U.S. PATENT DOCUMENTS

| | | |
|---|---|---|
| 7,388,427 B2 | 6/2008 | Kim et al. |
| 7,394,313 B2 | 7/2008 | Kim et al. |
| 2004/0108901 A1 | 6/2004 | Apel et al. |
| 2005/0083117 A1 | 4/2005 | Kim et al. |

FOREIGN PATENT DOCUMENTS

| | | |
|---|---|---|
| EP | 1032120 | 8/2000 |
| EP | 1229642 | 8/2002 |
| EP | 1330021 | 7/2003 |
| EP | 1612932 | 6/2004 |
| JP | 09/036675 | 7/1997 |
| JP | 09036675 | 7/1997 |
| KR | 20010105151 | 11/2001 |

OTHER PUBLICATIONS

Office Action dated Jan. 30, 2009 in U.S. Appl. No. 11/651,166.
Notice of Allowance and Fees Due dated Jul. 14, 2009 in U.S. Appl. No. 11/651,166.
Notice of Allowance and Fees Due dated Sep. 9, 2009 in U.S. Appl. No. 11/651,166.

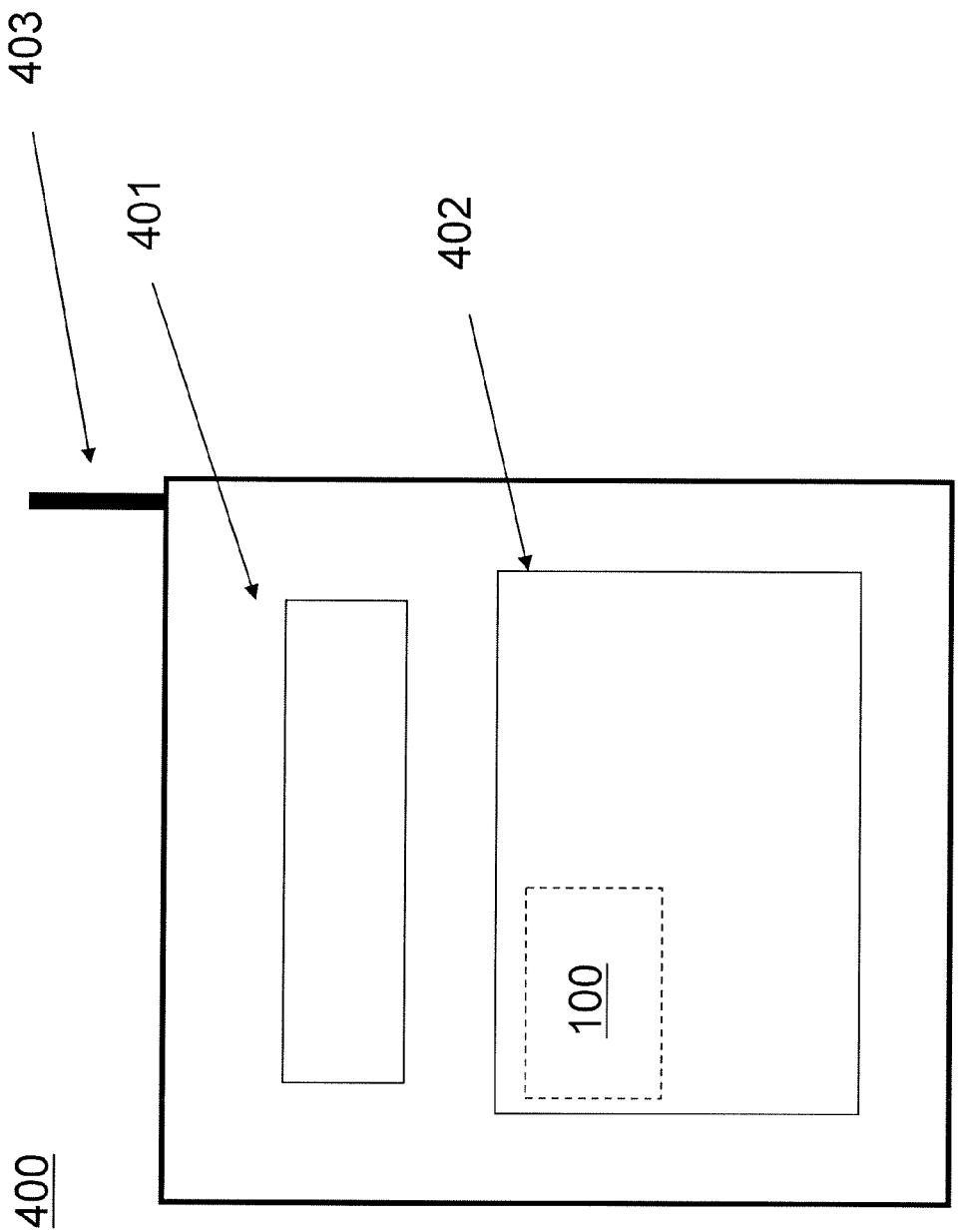

MULTIPLE OUTPUT POWER MODE AMPLIFIER

CROSS-REFERENCE TO RELATED APPLICATION

The present application is a continuation of commonly owned U.S. patent application Ser. No. 11/651,166 filed on Jan. 9, 2007, now U.S. Pat. No. 7,616,054 entitled "MULTIPLE OUPUT POWER MODE AMPLIFIER" naming Moon-Suk Jeon, et al. as the inventors. Priority is claimed under 35 U.S.C. §120 to this cross-referenced application, and the entire disclosure of this application is specifically incorporated herein by reference.

BACKGROUND

Wireless devices are ubiquitous in many parts of the world. For example, portable wireless devices such as mobile phones, personal digital assistants (PDAs) and portable computers (e.g., laptop computers) are a convenience, if not a necessity.

In addition to being more prevalent, wireless devices are becoming smaller and lighter. Often, this translates into a reduction in the physical size and thus power of the battery powering the device. At the same time the battery is becoming smaller, the demand for 'use-time' (e.g., talk time of a mobile phone, or increased computing time for a laptop computer or PDA) is increasing. As can be appreciated, the demand for increased use-time can readily be met by increasing the power of the battery. Increased power of the battery often requires increasing the physical size of the battery. Accordingly, the goal of reducing the size of the battery competes with the goal of increasing the available power of the battery. This has lead to investigating options to increase the battery life in smaller batteries in wireless devices.

In a many portable wireless devices, the radio frequency (RF) power amplifier consumes a substantial portion of the power of the overall system of the device. As a result, poor efficiency in the RF power amplifier degrades the efficiency of the overall system, drains the battery more rapidly, and reduces the use-time. For this reason, much research in this field concentrates on increasing the efficiency of the RF power amplifier. If the RF power amplifier is more efficient, power drain on the battery is reduced. This in turn increases the use-time of the device per batter charge.

SUMMARY

In accordance with an illustrative embodiment, an amplifier includes a high-power signal path; a low-power signal path; and a bypass signal path. No radio frequency (RF) switches are provided between an input and the bypass-signal path.

In accordance with another illustrative embodiment, a radio frequency (RF) amplifier includes: a high-power signal path, which includes a first amplifier and a second amplifier; a low-power signal path, which includes the second amplifier; a bypass power signal path, which includes a power amplifier (PA) bypass network. The RF amplifier also includes an impedance matching and power dividing network adapted to provide power to the bypass power signal path and to one of the high-power signal path or the low-power signal path.

In accordance with yet another representative embodiment, an electronic device includes a radio frequency (RF) amplifier. The RF amplifier includes a high-power signal path; a low-power signal path; and a bypass signal path. No radio frequency (RF) switches are provided between an input and the bypass-signal path.

BRIEF DESCRIPTION OF THE DRAWINGS

Representative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 4 is a conceptual diagram of an electronic device in accordance with a representative embodiment.

DEFINED TERMINOLOGY

The terms 'a' or 'an', as used herein are defined as one or more than one.

The term 'plurality' as used herein is defined as two or more than two.

The term 'PA' is an abbreviation for power amplifier and specifically is not an abbreviation for prior art.

DETAILED DESCRIPTION

In the following detailed description, for purposes of explanation and not limitation, specific details are set forth in order to provide a thorough understanding of example embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of hardware, software, firmware, materials and methods may be omitted so as to avoid obscuring the description of the illustrative embodiments. Nonetheless, such hardware, software, firmware, materials and methods that are within the purview of one of ordinary skill in the art may be used in accordance with the illustrative embodiments. Such hardware, software, firmware, materials and methods are clearly within the scope of the present teachings. Furthermore, although described respect to a multiple mode amplifier, the present teachings may be applied to other types of circuit besides amplifiers.

In certain representative embodiments, switches are not used to control the power mode (i.e., bypass, low-power, high-power) of amplifier circuits. For instance, switches such as relays, micromachined switches, transistor switches, PIN diode switches, and Schottky diode switches are not included. As can be appreciated, these switches and external control circuits are comparatively large and costly. By foregoing the use of switches and external control circuits therefor, the cost and dedicated area for the amplifier can be comparatively reduced.

Figure 1:
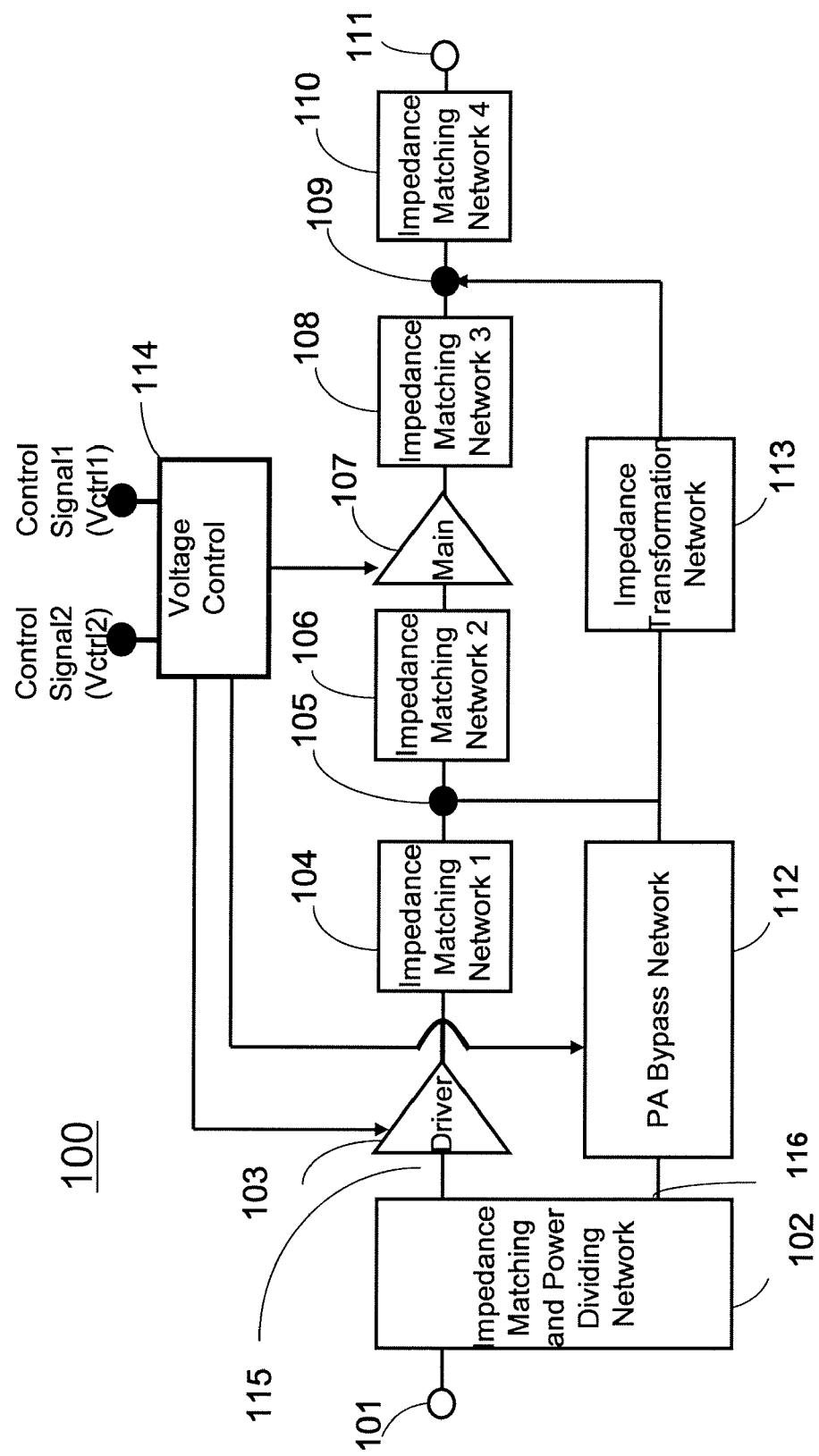
FIG. 1 is a simplified schematic diagram of a multiple output power mode amplifier in accordance with a representative embodiment.

FIG. 1 is a simplified schematic diagram of a multiple power mode power amplifier (PA) 100 in accordance with a representative embodiment. Beneficially, the PA 100 provides comparatively high efficiency without including a bypass switch circuit at least at an input 101. In other words, the PA 100 does not include switches or switching devices at least at the input 101 to direct signal flow along different signal paths.

The PA 100 includes an impedance matching and power dividing network 102 having the input 101; a driver 103 adapted to amplify an input signal; a power stage 107 for receiving power amplified by the driver 100 through a first impedance matching network 104 connected to the driver 103 and a second impedance matching network 106 connected to the first impedance matching network 104. The power stage 107 is adapted to re-amplify the signal from the second matching network 106 and to provide the signal to a third impedance matching network 108 and a fourth impedance matching network 110. Ultimately signals are provided to an output 111 of the PA 100.

The PA 100 also includes: a PA bypass network 112 and an impedance transformation network 113. A signal from the impedance matching and power dividing network 102 bypasses the amplification stages when the PA bypass network 112 is engaged. This signal is provided to the network 113 and ultimately to the output 111 via the fourth impedance matching network.

As described more fully herein, a bypass signal path of representative embodiments begins with signal division at the impedance matching and power dividing network 102. The bypass signal traverses the PA bypass network 112, the impedance transformation network 113 and is input to the fourth impedance matching network 110. Beneficially, between the input 101 and the bypass signal path, no RF switches are provided. This is in contrast to certain known power amplifiers where control of the signal at the input to the RF amplifier is effected by RF switches.

The low-power signal path begins with signal division at the network 102. The low-power signal traverses the driver 103, the first impedance matching network 104, the impedance transformation network 113 and is input to the fourth matching network 110.

The high-power signal path begins with signal division at the network 102. The signal traverses the driver 103, the first and second impedance matching networks 105,106, the power stage 107 and the fourth impedance matching network 110.

Notably, certain details of the components and the function of the components of the PA 100 used in the low-power mode and the high-power mode describe presently may be found in U.S. Patent Publication 2005/0080083117 A1 entitled "Multiple Power Mode Amplifier with Bias Modulation Option and without Bypass Switches" to Kim, et al. The disclosure of this commonly assigned publication (application) is specifically incorporated herein by reference.

The impedance transformation network 113 is an impedance transforming circuit that transforms impedance appropriately corresponding to the bypass mode, the low-power mode or the high-power mode. In the bypass mode, the impedance transformation network 113 forms a path (bypass-mode signal path) that bypasses the driver 103 and the power stage 107 so that the output of the PA Bypass Network is transferred through a node 109 to an amplifier output 111.

In a low power mode, the impedance transformation network 113 forms a path (low-power signal path) that does not traverse the power stage 107, so that output of the driver 103 is transferred through node 105 to node 109 and to the output 111 of the PA 100.

In high-power mode, the impedance transformation network 113 forms a path through the driver 103 and power stage 107 to the output 111, by providing a comparatively high input impedance as seen by the PA Bypass network 112 and the first impedance matching network 104. As will be appreciated, bypass mode provides the lowest power consumption; the low-power mode provides mid-level power consumption; and the high-power mode provides the greatest power consumption of the PA 100.

A voltage controller 114 is connected to the driver 103, the power stage 107, and the PA Bypass network 112. The controller 114 is adapted to engage a particular power mode (i.e., bypass power mode, low-power mode and high-power mode) as needed. The voltage controller 114 adjusts the voltage applied to the power stage 107, the driver 103 and the PA Bypass Network 112. As described more fully herein, the selective application of voltages to these components renders the 'on' or 'off' as desired, to engage these power modes. The controller 114 may be instantiated in software, hardware or firmware, or a combination thereof to provide the requisite logical control of the noted components of the PA 100.

In the high-power mode, the controller 114 applies voltage to the driver 103 for appropriate operation of the transistors (not shown) of the driver 103. With the driver 103 'on', an input signal from a first output 115 of the impedance matching network 102 is amplified by the driver 103. The amplified signal is input to the first impedance matching network 104 and then to the second impedance matching network 106. Next, the signal is input to the power stage 107. In the high-power mode, the voltage controller 114 applies voltage appropriate for operations of transistors (not shown) of the power stage 107. As such, the signal input to the power stage 107 is further amplified, and after traversing third and fourth impedance matching networks 108, 110, respectively, the signal is provided to an output 111 of the PA 100.

In the high power mode, the power stage 107 is 'on' and the input impedance $Z_{IN\text{-}PS}$ of power stage 107 as viewed from the first impedance matching network 104 is smaller than input impedance of low-power signal path $Z_{IN\text{-}L}$ and the input impedance bypass signal path ($Z_{IN\text{-}BP}$) as viewed from the first impedance matching network 104. The impedance transformation network 113 in conjunction with the third impedance matching network 108 and the fourth impedance matching network 110 combine to increase the input impedance of the low-power signal path ($Z_{IN\text{-}L}$) and the input impedance ($Z_{IN\text{-}BP}$) of the bypass signal path well above $Z_{IN\text{-}PS}$ of the power stage 107 in the high power mode.

The second impedance matching network 106 is operative to increase the impedance level as viewed from the first impedance matching network 104 while providing interstage matching in the high power mode. Thus, most power amplified by the driver 102 and transferred to the node 105, is amplified by the power stage 107 and is transferred to the output 111 of the power PA 100, while minimizing power leakage to the impedance transformation network 113 by the third impedance matching network 108 and the fourth impedance matching network 109.

In the low-power mode, the signal from output 115 is provided to the driver 103, which is biased by voltage from the controller 114 as described above. However, in the presently described mode of operation, the power stage 107 is turned off by voltage applied by the controller 114, and the input impedance of the power stage 120 ($Z_{in\text{-}PS}$), as viewed from the first impedance matching network 104, is larger than the input impedance of a path through the impedance transformation network 113 ($Z_{in\text{-}ITN}$) as viewed from the first impedance matching network 104. Accordingly, at a node 105, the signal travels to the impedance transformation network 113. The network 113 transforms a comparatively high input impedance to a comparatively low output impedance. The signal is then input to the fourth impedance matching network 110 and to the output 111.

Beneficially, the PA bypass network 112 provides a comparatively high degree of isolation (high impedance $Z_{out\text{-}BPN}$ as viewed by the node 105). This usefully prevents significant current leakage from node 105 to the network 112, thereby improving the efficiency of the PA 100 in low-power mode. Moreover, the impedance transformation network 113 in conjunction with the third impedance matching network 108 and the fourth impedance matching network 110 is adapted to lower the impedance level as viewed from the first impedance matching network 104 in the low-power mode. Thus, the amount of power of the signal amplified by the driver 103, transferred to the node 105 and input to the impedance transformation network 113 is significantly or substantially larger than the amount of power input to the power stage 107. Finally, the leakage back to the power stage 107 from a node 109 is minimal due to the isolation provided by the power stage 107 and the action of the impedance matching networks 108, 110.

In the bypass-mode, the voltage controller 114 provides inputs to both the driver 103 and the power stage 107 turning these off. A signal from a second output 116 of the impedance matching and power dividing network 102 is provided to the PA Bypass network 112. A voltage applied to the network 112 turns on components (not shown in FIG. 1) of the network 112. In this mode the signal from the second output 116 is input to the network 112 and to the impedance transformation network 113.

The input impedance to the power stage 207 ($Z_{IN\text{-}PS}$) as viewed at the output of the network 112 is comparatively high, and little current leakage occurs to node 105. Thus, virtually all of the signal from the output from the network 112 is input to the impedance transformation network 113. As alluded to previously, the input impedance of the impedance transformation network 113 is comparatively high, and the output impedance is comparatively low. At node 109, the bypass signal is input to the fourth impedance matching network 110 and is provided to the amplifier output 111.

The use of the bypass mode may be useful in reducing power consumption of devices that include the PA 100. Beneficially, the battery of such devices can be made smaller in size and capacity, while possibly increasing the use-time of the device. For example, the input 101 may be from a driving circuit (not shown) that provides a certain power level. In certain modes of operation, the electronic device including the PA 100 may not require amplification beyond the power level provided by the driving circuit (e.g., approximately 5 dBm to approximately 10 dBm). As such, in certain operational modes, the electronic device may not need the low-power mode or the high-power mode. In such operational modes, the bypass mode of the representative embodiments may be engaged and, consequently, the power consumption and battery requirements of the electronic device, may be reduced.

Figure 2B:
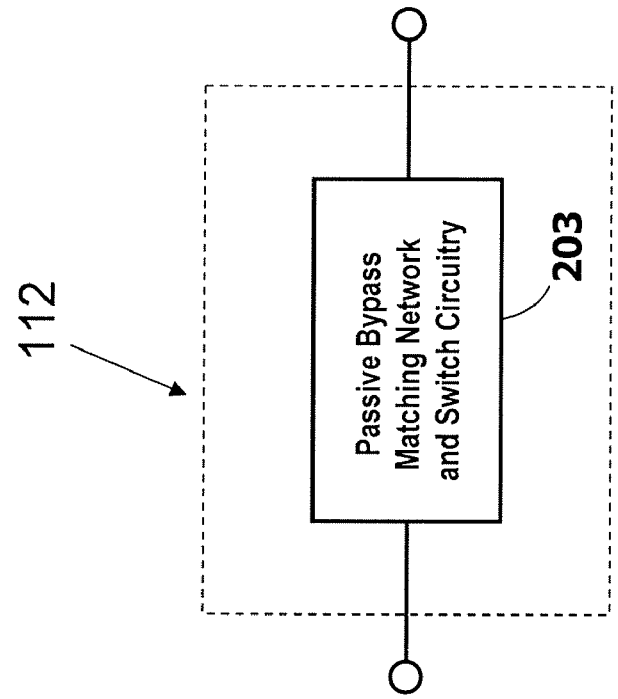
FIG. 2B is a block diagram of a power amplifier (PA) bypass network in accordance with a representative embodiment.
Figure 2A:
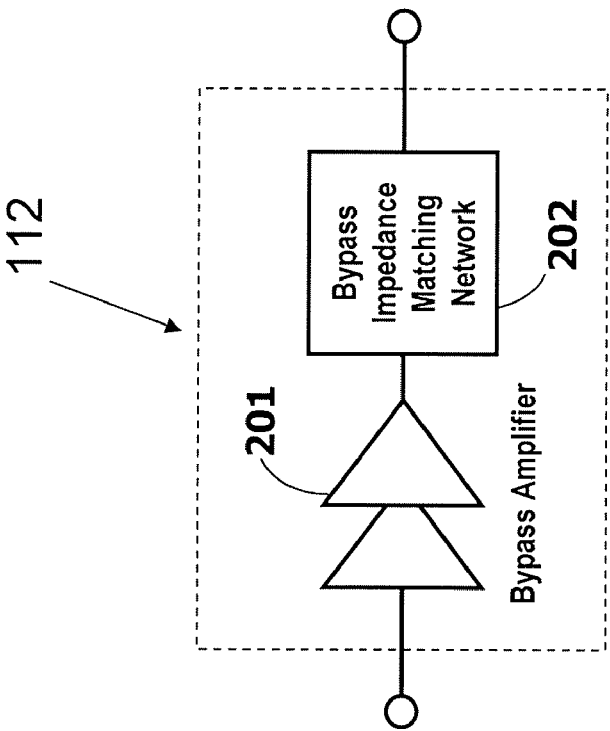
FIG. 2A is a simplified schematic diagram of a power amplifier (PA) bypass network in accordance with a representative embodiment.

The PA bypass network 112 may be implemented a variety of ways. FIGS. 2A and 2B are simplified schematic diagrams of two PA bypass networks 112 instantiated in a combination of active components and passive components, and in passive components, respectively, in accordance with representative embodiments.

In the representative embodiment shown in FIG. 2A, the network 112 includes a bypass amplifier 201 and a bypass impedance matching network 202. The amplifier 201 is a comparatively low-power amplifier, having one or more relatively low-power transistors. Thus, the current requirements of the amplifier 201 are comparatively small. Among other benefits, the physical size of the amplifier 201 may be small, and the efficiency of the bypass mode may be comparatively large.

In representative embodiments, the bypass amplifier 201 comprises a low-power transistor and requires a high input impedance of the bypass signal path ($Z_{IN\text{-}BP}$) for good linearity and efficiency. As noted previously, the input impedance of the bypass signal path ($Z_{IN\text{-}BP}$) is transformed to a comparatively high impedance by impedance transformation network 113 in conjunction with the third impedance matching network 108 and the fourth impedance matching network 110. Thus, the bypass amplifier 201 is substantially impedance-matched and additional optimization may be achieved with the bypass impedance matching network 202.

In the bypass mode, quiescent current of the transistor(s) of the comparatively small amplifier 201 is insignificant. As will be appreciated, this serves to improve the overall efficiency of the PA 100. In addition, the comparatively small transistor(s) of the amplifier 201 have a comparatively high output impedance. As a result, in low-power or high-power modes, the amplifier 201 provides good isolation and thus allows little reverse leakage current from nodes 104 and 109.

While the amplifier 201 is desirably a low-power/low gain amplifier, the amplifier 201 may provide some gain in the presently described embodiments. This added gain reduces the required input power level of the signal at the input 101. As will be appreciated, this allows for reduced current consumption at the signal source, which in turn, reduces current consumption of the amplifier 201. Ultimately, this serves to improve the efficiency of the PA 100. Moreover, by increasing the number of stages of bypass amplifier 201, sufficient gain in bypass mode is readily achievable.

The network 112 of FIG. 2B includes passive components such as a network of transmission lines, inductors and capacitors (not shown). However, there may be current leakage when the signal is divided by the impedance matching and power dividing network 102. Moreover, the comparatively poor isolation of the passive components may result in unwanted oscillation. Thus, to provide greater isolation, an RF switch (not shown) may be included in a passive bypass matching network and switch circuitry 203 of the network 112. Notably, the RF switch incorporated into the bypass matching network and switch circuitry 203 is a low-power (small) device. To this end, because this switch is not directly connected to the high-power mode signal path and only small amount of RF power (e.g., approximately 5 dBm to approximately 10 dBm) flows through this switch, a low-power RF switch suffices. Thus, additional insertion loss and cost is relatively small. Additionally, when the low-power mode or the high-power mode are engaged, the bypass matching network and switch circuitry 203 provides sufficient isolation so that reverse leakage current (e.g., from node 105 in low-power mode) is negligible.

The embodiments described to this point of the disclosure relate to three-mode operation; namely bypass-mode, low-power mode and high-power mode operation. In some applications it may be useful to provide only a bypass-mode and a high-power mode. With rather simple modification to components and operational levels, the PA 100 may be adapted to function in this manner. The components of the two-mode PA 100 and their function share significant commonality with the embodiments described in connection with the three-mode amplifier. Accordingly, many details are omitted to avoid obscuring the description of the present embodiments.

The high-power mode of operation in two-mode operation is substantially the same as described in connection with three-mode operation. The low-power mode is eliminated by modifying the voltage controller 114 to not provide turn-off voltage inputs to the power stage amplifier 107, thereby eliminating single stage amplification of the low-power mode. More significantly, the bypass-mode differs in function and component requirements.

In bypass-mode, the gain provided to the signal at the output 116 of the impedance matching and power dividing network 102 has a greater range and maximum value. For example, in a representative embodiment described previously, the signal at the input 101 was in the range of approximately 5 dBm to approximately 10 dBm, and the gain in the bypass signal path was comparatively small. In keeping with this illustration, the bypass-mode of the illustrative two-mode amplifier must provide gain sufficient to provide a signal at output 111 with a power level as great as approximately 16 dBm to approximately 19 dBm. As such, in the present embodiment, the output power of the bypass mode ranges from approximately 5 dBm to approximately 19 dBm.

In a representative embodiment, the gain of the bypass-mode can be readily increased by increasing the number of stages and the operating quiescent current. Moreover, the output power level of the bypass mode can be increased by increasing the transistor size of the amplifier 201. This will increase the quiescent current as well. In operation, when the maximum driving point of the bypass amplifier 201 is reached, the voltage controller 114 switches to high-power mode by turning off the PA bypass network 200 and turning on the driver 102 and the power stage 107.

While the two-mode amplifier does have benefits such as simplicity, this operational mode comes at a cost. Notably, with the increase in size of the amplifier 201 to meet the greater gain requirements, the quiescent current of the bypass mode increases. This will have negative impact in the current consumption in the bypass mode and thus a decreased efficiency. However, there are possible benefits due to a reduction in the number of switching points from two to one. To this end, and as will be appreciated, at each switching point from (i.e., bypass to low power mode (i.e., approximately 10 dBm) and low-to-high power mode (approximately 16 dBm to approximately 19 dBm) there is a marked reduction in amplifier efficiency. Thus, by reducing the number of modes and thus the number of switching points, the overall efficiency of the amplifier may be similar over its operational range.

Figure 3A:
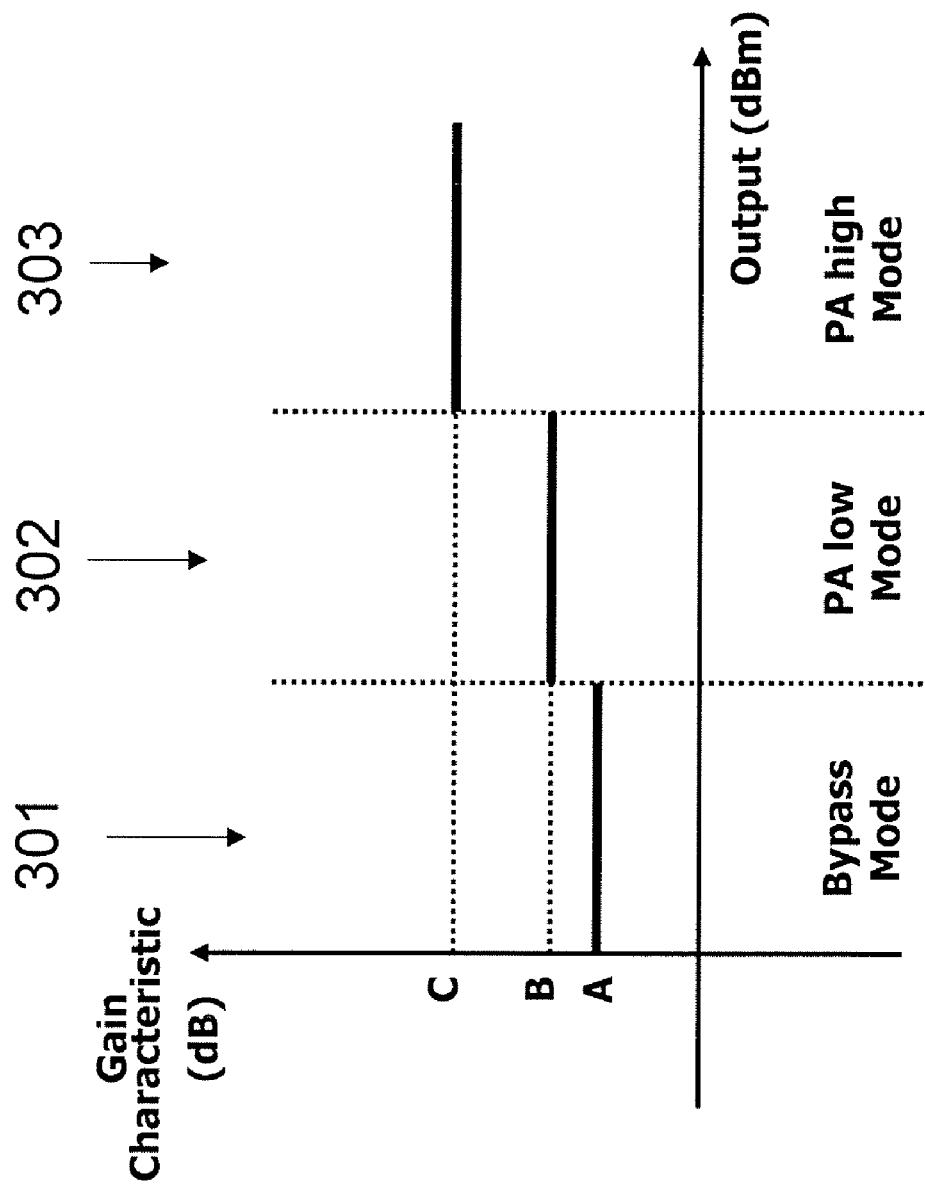
FIG. 3A is a graphical representation of a gain characteristic (relative) versus output power mode in accordance with a representative embodiment.

FIG. 3A is a graphical representation of the output versus gain of a three-mode amplifier in accordance with a representative embodiment. Gain 301 of the bypass mode is smaller than gain 302 of the low power mode 302. Gain 303 of the high power mode is greater than the other modes. Notably, the gain 301 of the bypass-mode is adjustable according to the system requirements. Each vertical line between gain curves represents a switching point between modes.

Figure 3B:
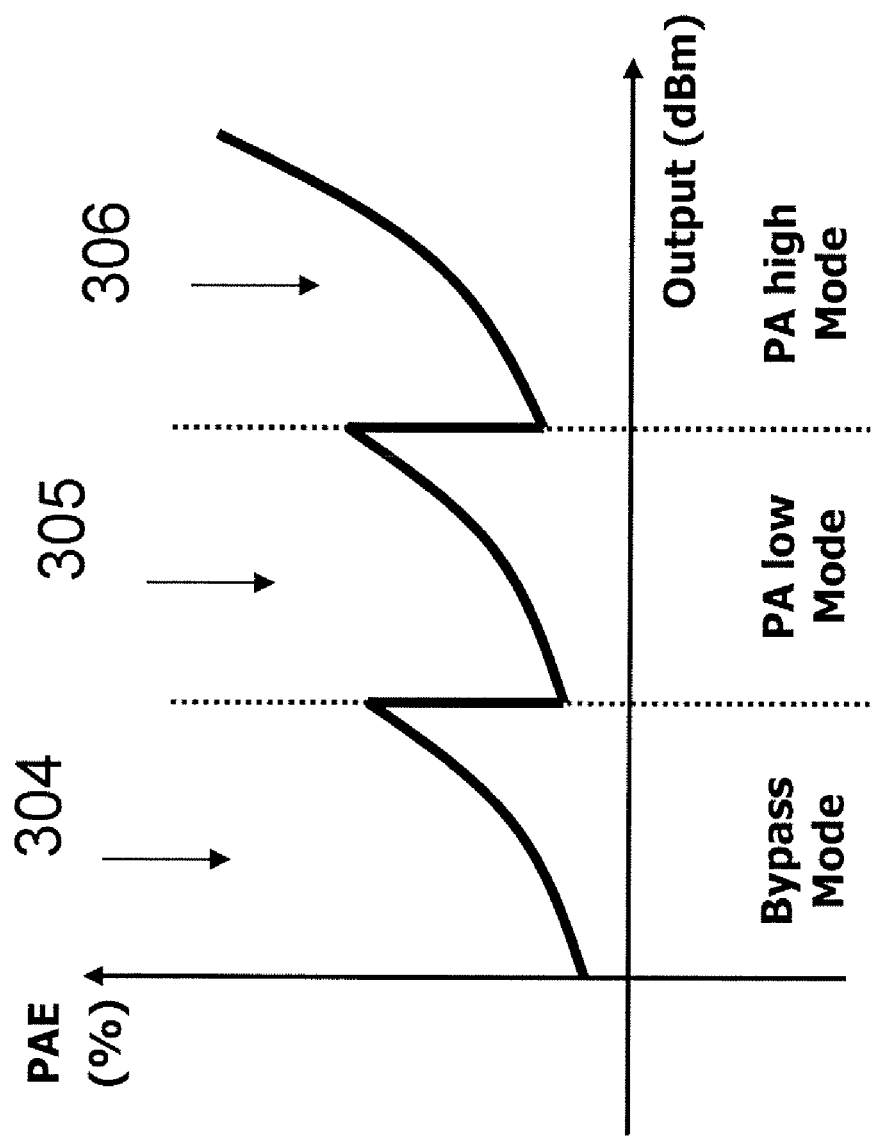
FIG. 3B is a graphical representation of relative power amplifier efficiency (PAE) versus output power mode in accordance with a representative embodiment.

FIG. 3B is a graphical representation of the output versus power amplifier efficiency (PAE) for the three modes of operation. Notably, the power amplifier efficiencies of FIG. 3B correspond to the outputs of the graph of FIG. 3A for consistency. The bypass mode shows a PAE 304 from initial turn-on of the PA 100 to the switching point (vertical line) to low-power mode. In low-power mode, a PAE 305 from over the range of the low-power mode is shown, and a PAE 306 is shown for the range of the high-power mode. Notably, at each switching point, as expected, the efficiency drops as shown.

Figure 3C:
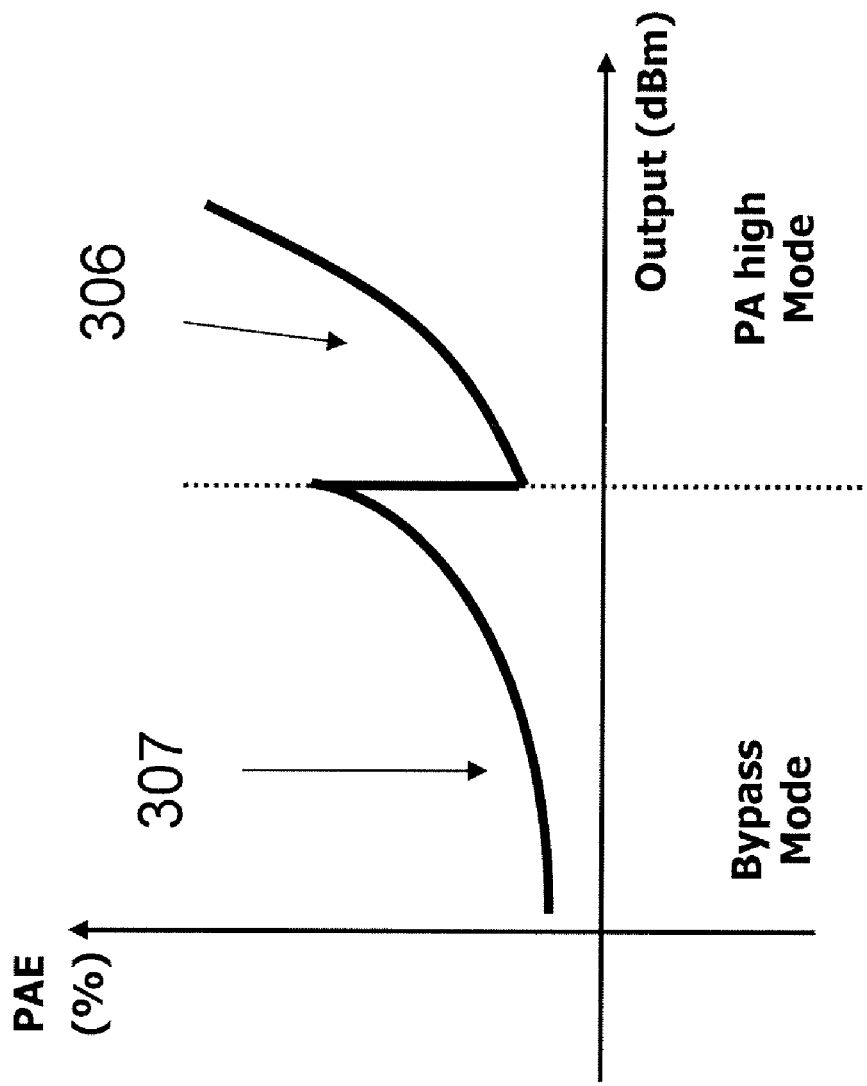
FIG. 3C is a graphical representation of the output versus power amplifier efficiency (PAE) for a two mode amplifier in accordance with a representative embodiment.

FIG. 3C is a graphical representation of the output versus power amplifier efficiency (PAE) for a two-mode amplifier. Notably, the graphs of FIG. 3C show the efficiency of a bypass mode and a high-power mode of operation. The two-mode amplifier is described above and forgoes the low-power mode by extending the operational range of the bypass signal path. In bypass mode the PAE 307 may extend from approximately 5 dbM to approximately 19 dBm in keeping with the illustration discussed previously.

FIG. 4 is a conceptual view of an electronic device 400 in accordance with a representative embodiment. The device 400 illustratively includes a display 401, an interface 402 and an antenna 403. Moreover, the device 400 includes the power PA 100 described previously. In representative embodiments, the device 400 may be a mobile (cellular) telephone, a personal digital assistant (PDA), a portable computer, a portable video player, a portable camera, a portable music player, a portable gaming device or a combination of one or more of these devices. It is emphasized that the noted devices are merely illustrative and that other devices having a need for improvements afforded by the present teachings are contemplated.

In connection with illustrative embodiments, multimode power amplifiers and electronic devices including multimode power amplifiers are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. An amplifier, comprising:
   a high-power signal path;
   a low-power signal path; and
   a bypass signal path comprising a power amplifier (PA) bypass network configured to transmit an input signal to an output with substantially no gain, wherein no radio frequency (RF) switches are provided between an input and the bypass-signal path.

2. An amplifier as claimed in claim 1, wherein the PA bypass network further comprises a an impedance matching network.

3. An amplifier as claimed in claim 1, further comprising a controller adapted to engage the high-power signal path to conduct an input signal to an output, while preventing the low-power signal path from conducting a significant portion of the input signal.

4. An amplifier as claimed in claim 1, wherein the PA bypass network further comprises a passive bypass impedance matching network and switching circuitry.

* * * * *